United States Patent
Zheng (10) Patent No.: US 10,339,987 B2
(45) Date of Patent: Jul. 2, 2019

(54) METHOD AND DEVICE FOR ADJUSTING HARDWARE REFRESH RATE OF TERMINAL

(71) Applicant: ZTE CORPORATION, Guangdong (CN)

(72) Inventor: Chao Zheng, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 254 days.

(21) Appl. No.: 15/310,976

(22) PCT Filed: May 14, 2015

(86) PCT No.: PCT/CN2015/078947
§ 371 (c)(1),
(2) Date: Nov. 14, 2016

(87) PCT Pub. No.: WO2015/172725
PCT Pub. Date: Nov. 19, 2015

(65) Prior Publication Data
US 2017/0092340 A1    Mar. 30, 2017

(30) Foreign Application Priority Data

May 14, 2014 (CN) .......................... 2014 1 0204335

(51) Int. Cl.
*G11C 7/10* (2006.01)
*G06F 3/14* (2006.01)
(Continued)

(52) U.S. Cl.
CPC .............. *G11C 7/1072* (2013.01); *G06F 3/14* (2013.01); *G09G 5/18* (2013.01); *G09G 3/3611* (2013.01);
(Continued)

(58) Field of Classification Search
CPC ................... G11C 7/1072; G09G 5/18; G09G 2340/0435; G09G 2330/021; G09G 3/3611; G09G 5/12; G06F 3/14; Y02D 10/34
See application file for complete search history.

(56) References Cited

U.S. PATENT DOCUMENTS 8,334,857 B1 * 12/2012 Ogrinc ................... G09G 5/377
345/204
8,542,221 B1 * 9/2013 Wyatt ..................... G06F 15/00
345/204

(Continued)

FOREIGN PATENT DOCUMENTS

WO        03/100759 A1    12/2003

OTHER PUBLICATIONS

Extended Supplementary European Search Report dated May 29, 2017 received in European Patent Application No. 15 79 3377.1.
(Continued)

*Primary Examiner* — William A Beutel
(74) *Attorney, Agent, or Firm* — Scully Scott Murphy & Presser (57) ABSTRACT

Disclosed are a method and device for adjusting the hardware refresh rate of a terminal, wherein the method includes: predicting the frame rate of the currently operating software of a terminal in a future preset time period; and adjusting the hardware refresh frequency of the terminal according to the predicted frame rate. The adjustment method automatically adjusts the hardware refresh rate, thus reducing the power consumption of a terminal.

16 Claims, 5 Drawing Sheets

(51) Int. Cl.
*G09G 5/18* (2006.01)
*G09G 3/36* (2006.01)
*G09G 5/12* (2006.01)

(52) U.S. Cl.
CPC ......... *G09G 5/12* (2013.01); *G09G 2330/021* (2013.01); *G09G 2340/0435* (2013.01); *Y02D 10/34* (2018.01)

(56) References Cited

U.S. PATENT DOCUMENTS

| | | | | |
|---|---|---|---|---|
| 2003/0006949 | A1* | 1/2003 | Sekiya | G09G 3/2011 345/87 |
| 2004/0252115 | A1* | 12/2004 | Boireau | G09G 3/2003 345/211 |
| 2013/0141642 | A1* | 6/2013 | Wu | G06F 3/1407 348/441 |
| 2013/0265294 | A1* | 10/2013 | Kim | G09G 3/20 345/214 |
| 2016/0275916 | A1* | 9/2016 | Glen | G09G 5/395 |

OTHER PUBLICATIONS

International Search Report dated Jul. 30, 2015 issued in PCT/CN2015/078947.

\* cited by examiner

METHOD AND DEVICE FOR ADJUSTING HARDWARE REFRESH RATE OF TERMINAL

CROSS-REFERENCE TO RELATED APPLICATION

This application is the 371 application of PCT Application No. PCT/CN2015/078947, filed May 14, 2015, which is based upon and claims priority to Chinese Patent Application No. 201410204335.5, filed May 14, 2014, the entire contents of which are incorporated herein by reference.

TECHNICAL FIELD

The present disclosure relates to the technical field of terminal display, and more particularly, to a method and a device for adjusting a hardware refresh rate of a terminal.

BACKGROUND

A battery life becomes a common defect of a smart mobile terminal at current, while power consumption of an LCD screen therein occupies most of the battery life. The battery life can be greatly improved and the user experience of the product can be improved if the power consumption of the lcd screen is reduced. For a display aspect, there are two kinds of refresh rates. One refers to a software frame rate, which is an actual refresh frequency of a system, for example, a standing picture is substantially at 0-1 frame and for a large-scale game picture, the software frame rate can reach 60 frames. The other is a hardware refresh rate, wherein an actual LCD hardware refresh rate of a product is refreshed at a fixed frequency, for instance, 60 fps. In this way, there is a difference between the two refresh rates In fact, if the software frame rate is lower while the hardware refresh rate is higher, a frame rate sensed by a user is still the software frame rate, hardware is refreshed uselessly for multiple times, which improves the power consumption of the LCD screen, so that the power dissipation of the terminal is improved. Moreover, it is found from experiments that the power consumption can be improved in the case that the hardware refresh rate of the lcd is reduced.

This section provides background information related to the present disclosure which is not necessarily prior art.

SUMMARY

The embodiments of the present disclosure provide a method and a device for adjusting a hardware refresh rate of a terminal, which can at least automatically adjust the hardware refresh rate, so as to reduce the power consumption of the terminal.

In order to at least solve the foregoing technical problems, the embodiments of the present disclosure provide a method for adjusting a hardware refresh rate of a terminal, which includes the following steps:

predicting a frame rate of a currently operating software of the terminal in a future preset time period; and adjusting the hardware refresh frequency of the terminal according to the predicted frame rate.

The step of predicting the frame rate of the currently operating software of the terminal in the future preset time period includes:

collecting at least one information of a real-time frame rate of the software, related information of a software graphic processing unit in the terminal and historical frame rate information of the software when operating in a foreground, the related information of the software graphic processing unit including: frequency information and load information of the software graphic processing unit; and predicting the frame rate of the currently operating software of the terminal in the future preset time period according to at least one information of the real-time frame rate of the software, the related information of the software graphic processing unit and the historical frame rate in formation.

In one embodiment of the present disclosure, the step of collecting at least one information of the real-time frame rate of the software, the related information of the software graphic processing unit in the terminal and the historical frame rate information of the software when operating in the foreground includes: collecting the related information of the software graphic processing unit in the terminal; and the step of predicting the frame rate of the currently operating software of the terminal in the future preset time period according to at least one information of the real-time frame rate of the software, the related information of the software graphic processing unit and the historical frame rate information includes:

judging a current frame rate scene of the software according to the frequency information and the load information; and predicting the frame rate of the software in the future preset time period according to a judgment result.

The step of judging the current frame rate scene of the software according to the frequency information and the load information includes:

judging whether the software is under a stable frame rate scene, a suddenly-increased frame rate scene or a suddenly-decreased frame rate scene at current according to the frequency information and the load information; and the step of predicting the frame rate of the software in the future preset time period according to the judgment result includes:

when the software is under the stable frame rate scene, acquiring the real-time frame rate of the software, and acquiring the frame rate of the software in the future preset time period according to the real-time frame rate;

when the software is under the suddenly-decreased frame rate scene, acquiring the historical frame rate information of each software when operating in the foreground, determining a software type of the software according to the historical frame rate information, and acquiring the frame rate of the software in the future preset time period according to a determination result; and when the software is under the suddenly-increased frame rate scene, setting the frame rate of the software in the future preset time period according to a preset rule.

In another embodiment of the present disclosure, the step of collecting at least one information of the real-time frame rate of the software, the related information of the software graphic processing unit in the terminal and the historical frame rate information of the software when operating in the foreground includes: collecting the real-time frame rate of the software and the related information of the software graphic processing unit in the terminal; and the step of predicting the frame rate of the currently operating software of the terminal in the future preset time period according to at least one information of the real-time frame rate of the software, the related information of the software graphic processing unit and the historical frame rate information includes:

obtaining a value of the frame rate of the software in the future preset time period according to the real-time frame rate of the software; and judging whether the value of the frame rate needs to be adjusted according to the frequency information and the load information; if yes, then adjusting the value of the frame rate; and if no, maintaining the value of the frame rate unchanged.

The step of judging whether the value of the frame rate needs to be adjusted according to the frequency information and the load information includes:

determining the current frame rate scene of the software according to the frequency information and the load information; and judging whether the value of the frame rate needs to be adjusted according to the determination result.

The step of determining the current frame rate scene of the software according to the frequency information and the load information includes: determining whether the software is under a stable frame rate scene, a suddenly-increased frame rate scene or a suddenly-decreased frame rate scene at current according to the frequency information and the load information; and the step of judging whether the value of the frame rate needs to be adjusted according to the determination result includes:

when judging that the software is under the stable frame rate scene, determining that the value of the frame rate does not need to be adjusted; and when judging that the software is under the suddenly-increased frame rate scene or the suddenly-decreased frame rate scene, determining that the value of the frame rate needs to be adjusted.

The step of adjusting the value of the frame rate when judging that the software is under the suddenly-decreased frame rate scene includes:

determining a software type of the software, and acquiring the frame rate of the software in the future preset time period according to the determination result again.

The step of determining the software type of the software includes:

acquiring the historical frame rate information of each software in the terminal when operating in the foreground, and determining the software type of the software according to the historical frame rate information.

The foregoing step of determining the software type of the software according to the historical frame rate information includes: determining whether the software belongs to a reading type software, an ordinary type software or a game type software according to the historical frame rate information.

Similarly, in order to at least solve the foregoing technical problems, the embodiments of the present disclosure further provide a device for adjusting a hardware refresh rate of a terminal, which includes: a frame rate predicting module and an adjusting module, wherein:

the frame rate predicting module is configured to predict a frame rate of a currently operating software of the terminal in a future preset time period; and the adjusting module is configured to adjust the hardware refresh frequency of the terminal according to the predicted frame rate.

The frame rate predicting module includes: a collection module and a frame rate prediction processing module, wherein:

the collection module is configured to collect at least one information of a real-time frame rate of the software, related information of a software graphic processing unit in the terminal and historical frame rate information of the software when operating in a foreground, the related information of the software graphic processing unit including: frequency information and load information of the software graphic processing unit; and the frame rate prediction processing module is configured to predict the frame rate of the currently operating software of the terminal in the future preset time period according to at least one information of the real-time frame rate of the software, the related information of the software graphic processing unit and the historical frame rate information.

In one embodiment of the present disclosure, the collection module is configured to collect the related information of the software graphic processing unit in the terminal; and the frame rate prediction processing module is configured to judge a current frame rate scene of the software according to the frequency information and the load information, and predict the frame rate of the software in the future preset time period according to a judgment result.

The frame rate prediction processing module is configured to judge whether the software is under a stable frame rate scene, a suddenly-increased frame rate scene or a suddenly-decreased frame rate scene at current according to the frequency information and the load information; and when the software is under the stable frame rate scene, acquire the real-time frame rate of the software, and acquire the frame rate of the software in the future preset time period according to the real-time frame rate; when the software is under the suddenly-decreased frame rate scene, acquire the historical frame rate information of each software when operating in the foreground, determine a software type of the software according to the historical frame rate information, and acquire the frame rate of the software in the future preset time period according to a determination result; and when the software is under the suddenly-Increased frame rate scene, set the frame rate of the software in the future preset time period according to a preset rule.

In another embodiment of the present disclosure, the collection module is configured to collect the real-time frame rate of the software and the related information of the software graphic processing unit in the terminal; and the frame rate prediction processing module is configured to obtain a value of the frame rate of the software in the future preset time period according to the real-time frame rate of the software; and judge whether the value of the frame rate needs to be adjusted according to the frequency information and the load information; if yes, then adjust the value of the frame rate; and if no, maintain the value of the frame rate unchanged.

The frame rate prediction processing module is configured to determine the current frame rate scene of the software according to the frequency information and the load information; and judge whether the value of the frame rate needs to be adjusted according to the determination result.

The frame rate prediction processing module is configured to determine whether the software is under a stable frame rate scene, a suddenly-increased frame rate scene or a suddenly-decreased frame rate scene at current according to the frequency information and the load information; when judging that the software is under the stable frame rate scene, determine that the value of the frame rate does not need to be adjusted; and when judging that the software is under the suddenly-increased frame rate scene or the suddenly-decreased frame rate scene, determine that the value of the frame rate needs to be adjusted.

The frame rate prediction processing module is configured to, when judging that the software is under the suddenly-decreased frame rate scene, determine a software type of the software, and acquire the frame rate of the software in the future preset time period according to the determination result.

The frame rate prediction processing module is configured to acquire the historical frame rate information of each software in the terminal when operating in the foreground, and determine the software type of the software according to the historical frame rate information.

The process of determining the software type of the software by the frame rate prediction processing module according to the historical frame rate information includes: determining whether the software belongs to a reading type software, an ordinary type software or a game type software according to the historical frame rate information.

The embodiments of the present disclosure have the following advantageous effects:

the embodiments of the present disclosure provide the method and the device for adjusting a hardware refresh rate of a terminal, which can automatically adjust the hardware refresh rate, so as to reduce the power consumption of the terminal. Specifically, the method according to the embodiments of the present disclosure includes: predicting the frame rate of the currently operating software of the terminal in the future preset time period; and adjusting the hardware refresh frequency of the terminal according to the predicted frame rate. In the method according to the embodiments of the present disclosure, the hardware refresh rate of the terminal is dynamically adjusted according to the future software frame rate, so that the frame rate of the software and the hardware refresh rate can be adapted dynamically, and the power consumption of a terminal screen is optimized, thus achieving the effect of optimizing the power consumption of the terminal. Compared with the related art, the method according to the embodiments of the present disclosure saves the power consumption of the terminal, and increases the battery life of the terminal, thus improving the user experience.

This section provides a summary of various implementations or examples of the technology described in the disclosure, and is not a comprehensive disclosure of the full scope or all features of the disclosed technology.

DETAILED DESCRIPTION

The present disclosure will be further described in details hereinafter with reference to the specific embodiments and drawings.

Figure 1:
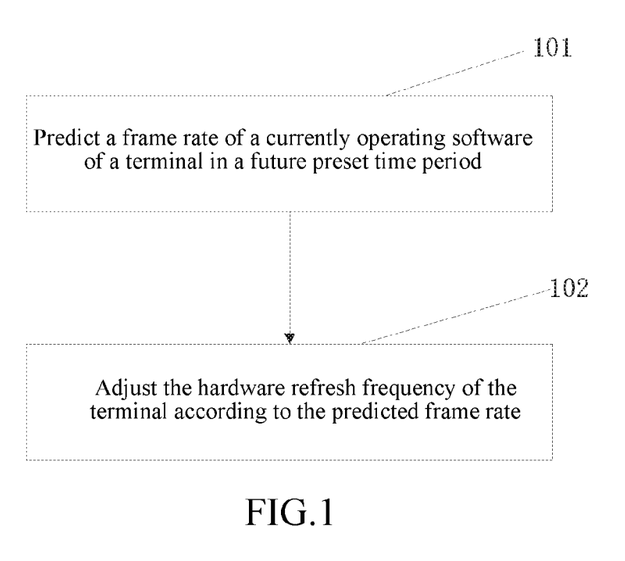
FIG. 1 is a schematic diagram illustrating a flow of a method for adjusting a hardware refresh rate of a terminal provided by a first embodiment of the present disclosure.

First Embodiment:

As shown in FIG. 1, the embodiment provides a method for adjusting a hardware refresh frequency of a terminal, including the following steps.

In step 101: a frame rate of a currently operating software of the terminal in a future preset time period is predicted.

The preset time period in the embodiment may be set according to actual requirements, for example, within 10 s in the future, or the like.

In step 102 the hardware refresh frequency of the terminal is adjusted according to the predicted frame rate.

The method according to the embodiment can dynamically adapt the frame rate of the software with the hardware refresh rate, and achieve an object of optimizing the power consumption of a display screen of the terminal, thus reducing the entire power consumption of the terminal.

According to the method of the embodiment, to adapt the hardware refresh rate with the frame rate of the software, the frame rate of the software in a later time period needs to be predicted according to various collected information, or the frame rate of the software in the time period may also be set according to an empirical value.

According to the method of the embodiment, various information may be collected, and the frame rate of the software in the future preset time period may be predicted according to the information. Preferably, the foregoing step 101 may include:

collecting at least one information of a real-time frame rate of the software, related information of a software graphic processing unit in the terminal and historical frame rate information of the software when operating in a foreground, the related information of the software graphic processing unit including: frequency information and load information of the software graphic processing unit; and predicting the frame rate of the currently operating software of the terminal in the future preset time period according to at least one information of the real-time frame rate of the software, the related information of the software graphic processing unit and the historical frame rate information.

Several predicting manners for predicting the frame rate of the software in future preset time period using an information predicting software by the method of the embodiment are introduced hereinafter.

1. Real-time frame rate of software:

The real-time frame rate of the software is acquired simply: when an image is refreshed, a counter is increased by 1; and the real-time frame rate information of the software can be obtained by counting number of times of image change in 1 s. The real-time frame rate of the software can be used as a basis for predicting the frame rate of the software in the future.

Therefore, the step 101 in the embodiment may include: collecting the real-time frame rate of the software, and predicting the frame rate of the currently operating software of the terminal in the future preset time period according to the real-time frame rate of the software.

In the present embodiment, several typical frame rates may be preset, the collected real-time frame rate of the software is compared with the preset frame rates, and the frame rate of the software in the future time period is set according to a comparison result.

Preferably, the preset frame rates of the embodiment may be typical values of the hardware refresh rate, for example, the typical values of the hardware refresh rate are: F1, F2 and F3, wherein F1<F2<F3; after the real-time frame rate of the software Fs is collected, the real-time frame rate Fs is compared with F1, F2 and F3:

if Fs<F1(15), then a predictive value of the frame rate of the software in the future time period is set to be Fh=F1;

if F1(15)<Fs<F2(40), then a predictive value of the frame software: in the future me period is set to be Fh=F2; and if Fs>F2(40), then a predictive value of the frame rate of the software in the future tame period is set to be Fh=F3.

It should be understood that according to the method of the embodiment, acquiring the frame rate of the software in the future according to the real-time frame rate of the software is not limited to the method introduced above; moreover, the value of the frame rate of the software in the future time period may he obtained by conducting a series of calculations on the real-time frame rate of the software.

2. Information of an graphic processing unit:

A mobile terminal having a display module is usually equipped with an independent graphic processing unit (for example, a GPU) to process some algorithms regarding lcd software drawing. When an image of an lcd software changes apparently, a frequency of the GPU will increase admittedly, and a load processed by the GPU will enlarge; moreover, the change of the GPU is very real-time and quick. Therefore, the frequency and the load of the GPU are related to the frame rate of the software, and the frame rate of the software in the future preset time period may be predicted according to the related information of the graphic processing unit.

Therefore, the step 101 in the embodiment may include: collecting the frequency information and the load information of the software graphic processing unit in the terminal, and predicting the frame rate of the currently operating software of the terminal in the future preset time period.

Specifically, the process of predicting the frame rate of the currently operating software of the terminal in the future preset time period according to the frequency information and the load information in the embodiment may include:

judging a current frame rate scene of the software according to the frequency information and the load information; and predicting the frame rate of the software in the future preset time period according to the determination result.

According to the method of the embodiment, a frame rate scene of the currently-operating software may be judged according to the frequency and the load of the GPU, and then the frame rate of the software in the future preset time period may be set according to the frame rate scene of the GPU.

Preferably, three frame rate scenes are preset in the method of the embodiment, including: a stable frame rate scene, a suddenly-increased frame rate scene and a suddenly-decreased frame rate scene. In the method of the embodiment, the process of judging the current frame rate scene of the software according to the frequency information and the load information may include: judging whether the software is under the stable frame rate scene, the suddenly-increased frame rate scene or the suddenly-decreased frame rate scene at current according to the frequency information and the load information. The following contents are referred to for a specific judging process.

For example, GPUFreq (GPU frequency) and the GPU-Load (load) information of the GPU in 10 s may be collected, and average information in 10 s is calculated, wherein the calculation method is as follows:

Freq_average=sum(GPUFreq(1),GPUFreq(10))/10

Load_average=sum(GPULoad(1),GPULoad(10))/10

The current GPUFreq and the current GPULoad are compared with the GPU information in the previous 10 s.

if GPUFreq-Freq_average>100 Mhz and GPULoad-Load_average>20, then this scene is deemed as a suddenly-increased software real-time frame rate scene; and if GPUFreq-Freq_average<−100 Mhz and GPULoad-Load_average<−20, then this scene is deemed as a suddenly-decreased software real-time frame rate scene.

A scene excluding the above two scenes is a stable frame rate scene.

After judging the current frame rate scene of the software, different values of the frame rate of the software in the future may be set according to different scenes. Preferably, the foregoing process of predicting the frame rate of the software in the future preset time period according to the judgment result may include the following several situations.

When the software is under the stable frame rate scene, the real-time frame rate of the software is acquired, and the frame rate of the software in the future preset time period is acquired according to the real-time frame rate. Or, a preset frame rate may be directly set as the frequency of the software in the future preset time period.

For a specific acquiring process, the foregoing introductions for acquiring the frame rate of the software in the future preset time period according to the real-time frame rate may be referred to.

When the software is under the suddenly-decreased frame rate scene, the historical frame rate information of each software when operating in the foreground is acquired, a software type of the software is determined according to the historical frame rate information, and the frame rate of the software in the future preset time period is acquired according to a determination result. Or, a preset frame rate may he directly set as the frequency of the software in the future preset time period.

In the embodiment, when the software is under the suddenly-decreased frame rate scene currently, the value of the frame rate of the software in the future time period may be set according to the software type to which the software belongs currently. Or, the preset frame rate may be directly set as the frequency of the software in the future preset time period. In the embodiment, the historical frame rate information of each software in the terminal when operating in the foreground may be recorded firstly, and then the software type of the software is determined according to the historical frame rate information. Certainly, the software type may also be determined through other manners, for example, may be determined through a software name.

In the embodiment, the process of determining the software type according to the historical frame rate information may also refer to the process below:

collecting and recording a frame rate of each application program when operating in the foreground, for example, collecting and recording a real-time frame rate of each application program for 500 times; and then performing a statistics on a frame rate range of each application program when operating in the foreground, and performing a statistics on the collected times of each application program in each frame rate range, which are as shown in the table below.

TABLE 1

| App Name | 0-15 frames | 15-40 frames | 40-60 frames |
|---|---|---|---|
| App1 | 50 | 50 | 400 |
| App2 | 400 | 100 | 0 |
| App3 | 100 | 350 | 50 |

Finally, a type of the application program (software) currently operating in the foreground may be judged according to the table:

(1) when a statistic value of the frame rate in the 40-60 frame range is S>350, then the application program is deemed to be a game type application, such as App1, which is under a high frame of 40-60 frames for a long term;

(2) when a statistic value of the frame rate in the 0-15 frame range is S>350, then the application program is deemed to be a reading type application, such as App2, most of the historical frame rates of App2 are below 15 frames, and then the application is marked as a reading type application;

(3) when the frame rate does not satisfy the above two conditions, then the application is marked as an ordinary type application; and (4) when a predetermined collection times is not implemented, the application is marked as the ordinary type application by default. That is, the frame rate is not collected. for 500 times.

The type of the software in the terminal currently operating in the foreground may be judged through the above process.

After the software type of the software is judged, the frame rate of the software in the future time may be set according to the judgment result. For example, three frame rates F1, F2 and F3 may be preset, wherein F1<F2<F3; when the software is an ordinary type software, the frame rate of the software Fh in the future time is set as F2; when the software is a game type software, it indicates that the frame rate of the software under the current application scene will be very high continuously, then the frame rate of the software Fh in the future time is set as F3 (the maximum frame rate value); and when the software is a reading type software, it indicates that the frame rate of the software under the current application scene will be relatively low continuously, then Fh is set as F1.

When the software is under the suddenly-increased frame rate scene, the frame rate of the software in the future preset time period is set according to a preset rule.

in the case that the software is under the suddenly-increased frame rate scene, it is possible that a user clicks or opens a software application with a high software frame rate currently, or the like; in order to prevent frame loss, the frame rate Fh in the future time period is set to be a high frame rate. For example, in the case that three preset frame rates (F1<F2<F3) are preset, the frame rate Fh may be set as F3.

Figure 2:
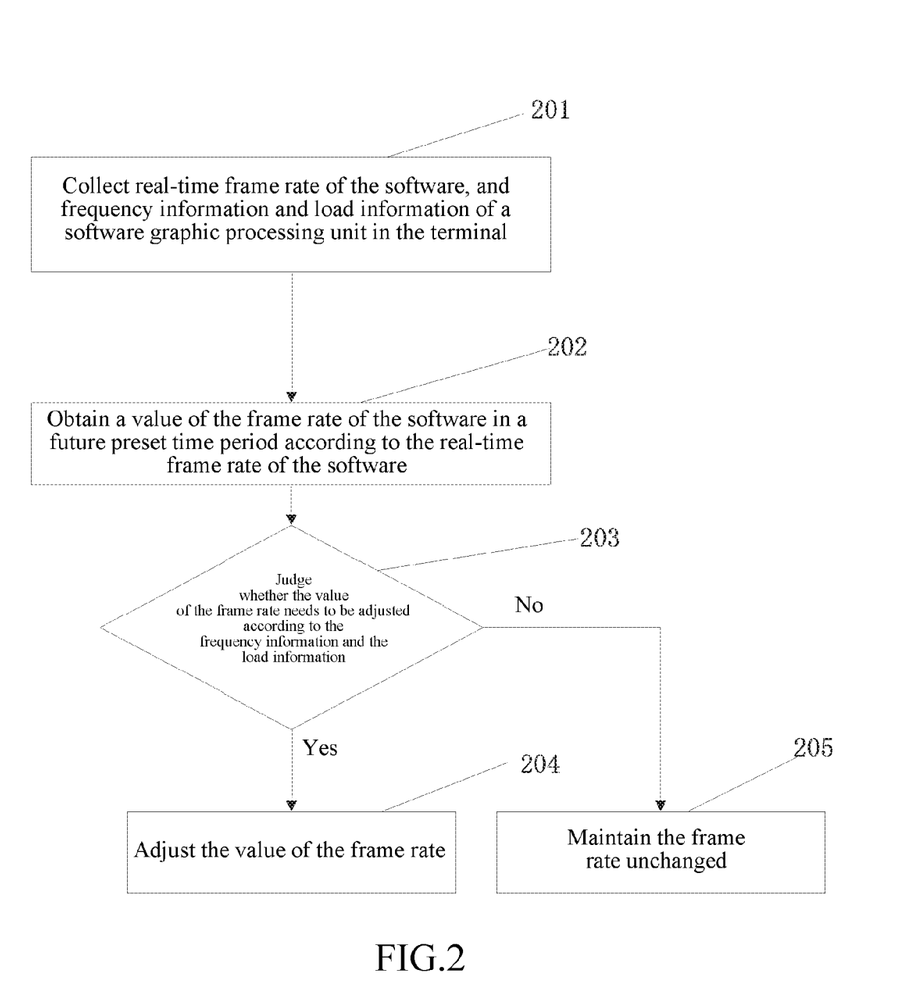
FIG. 2 is a schematic diagram illustrating a flow of predicting a frame rate of a software in a future preset time provided by the first embodiment of the present disclosure.

3. The frame rate of the software in the future time period is predicted using the real-time frame rate of the software with reference to the related information of the graphic processing unit. Because the frame rate of the software in the future time period is predicted simply using the real-time frame rate of the software in the first predicting manner above, the predicting will be accurate when the frame rate of the software fluctuates a little; however, under a scene in which the frame rate fluctuates quickly and largely, the information which is updated once in 1s cannot adapt with the image changes admittedly, which will cause that the set hardware refresh rate is lower than the frame rate of the software, thus causing a hazard of frame loss. Therefore, in order to prevent frame loss, the frame rate of the software in the future time period may be predicted using the real-time frame rate with reference to the related information of the processing unit in the method according to the embodiment. As shown in FIG. 2, the specific method according to the embodiment may include the following steps.

In step 201, a real-time frame rate of the software, and frequency information and load information of a software graphic processing unit in the terminal are collected.

In step 202, a value of the frame rate of the software in the future preset time period is obtained according to the real-time frame rate of the software.

As to the step of obtaining the value of the frame rate of the software in the future preset time, the introductions in the above first predicting manner may be referred to. For example, the Fh of the software in the future preset time period is set as F1.

In step 203, whether the value of the frame rate needs to be adjusted is judged according to the frequency information and the load information; if yes, then step 204 is performed; and if no, then step 205 is performed.

Preferably, the process of judging whether the value of the frame rate needs to be adjusted according to the frequency information and the load information may include: determining a current frame rate scene of the software according to the frequency information and the load information; and judging whether the value of the frame rate needs to be adjusted according to the determination result. For example, three frame rate scenes may be preset in the embodiment, including: a stable frame rate scene, a suddenly-increased frame rate scene and a suddenly-decreased frame rate scene. When determining that the software is under the stable frame rate scene, then it is determined that the value of the frame rate does not need to be adjusted, and the value of the frame rate of the software in the future time period acquired according to the real-time frame rate is maintained; at this moment, Fh is still F1. When determining that the software is under the suddenly-increased frame rate scene or suddenly-decreased frame rate scene, it indicates that the value of the frame rate of the software in the future time period acquired according to the real-time frame rate is not suitable for the current scene, and needs to be adjusted, and the adjusted value of the frame rate is used as a final value of the frame rate of the software in the future time period.

In step 204, the value of the frame rate is adjusted.

For example, in the case that the software is under the suddenly-increased frame rate scene, the value of the frame rate of the software in the future preset time period may be reset, for example, Fh is set as F3, i.e., Fh is set to be the maximum frame rate.

When determining that the software is under the suddenly-decreased frame rate scene, the process of adjusting the value of the frame rate of the software in the future preset time period may include: determining a software type of the software, and acquiring the frame rate of the software in the future preset time period according to the determination result again.

Preferably, the process of determining the software type of the software may include: acquiring historical frame rate information of each software in the terminal when operating in the foreground, and determining the software type of the software according to the historical frame rate information.

In this step, the introductions in the above third predicting manner may be referred to for the specific process of how to determine the software type of the software and how to adjust the value of the frame rate of the software in the future time period. For example, in this embodiment, it may be determined whether the software belongs to reading type software, ordinary type software or game type software according to the historical frame rate information; then the value of the frame rate of the software in the future time period is adjusted according to the software type of the software. For example, when determining that the software is the ordinary type software, Fh is set as F2; when the software is the reading type software, Fh is set as F1; and when the software is the game type software, Fh is set as F3.

In step 205, the value of the frame rate is maintained to be unchanged. That is, the value of the frame rate of software in the future time period acquired by using the real-time frame rate is used as a final value of the frame rate.

The above introduces the specific contents of the predicting manners 1 to 3, which uses a single type of collected information or two types of collected information to predict the value of the frame rate in the future preset time period. In the embodiment, the manners of adopting three types of collected information and adopting another two types of collected information to predict the value of the frame rate of the software in the future preset time period are similar to the above manner, or are combinations of the above predicting manners 1 to 3.

The hardware refresh rate of the terminal may be adjusted automatically through the method of the embodiment, thus achieving the object of optimizing the power consumption of the terminal.

Figure 3:
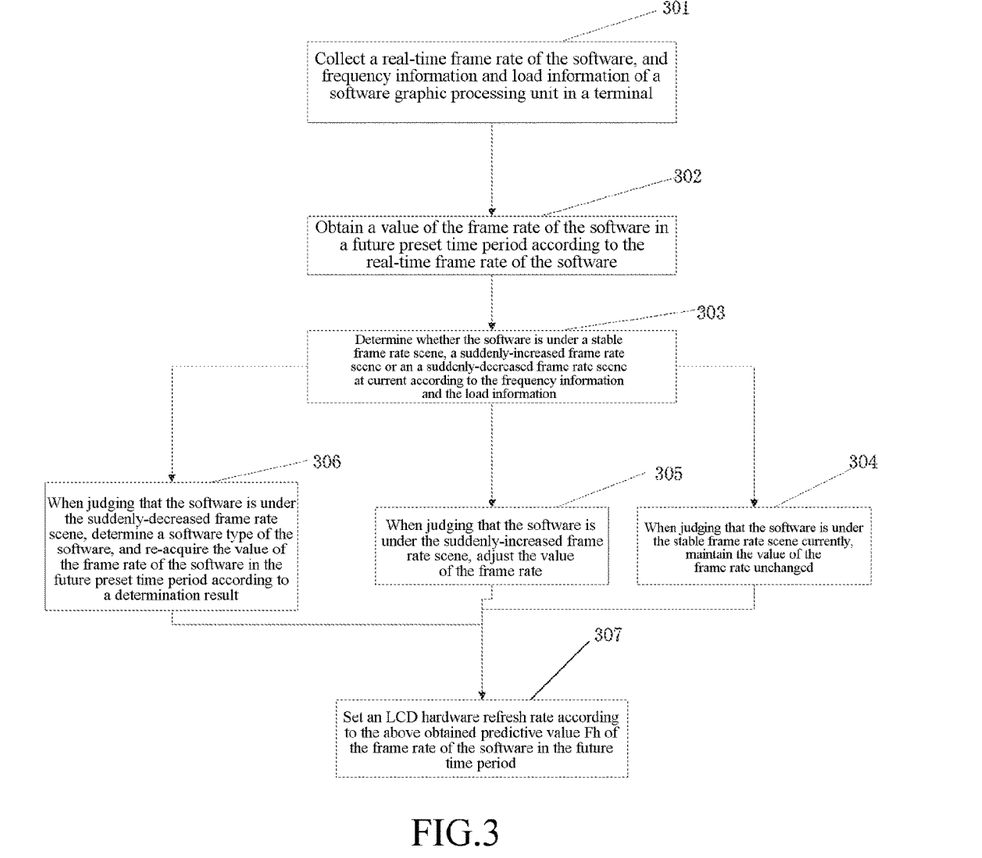
FIG. 3 is a schematic diagram illustrating a flow of a method for adjusting a hardware refresh rate of a terminal provided by a second embodiment of the present disclosure.

Second Embodiment:

In the embodiment, a Qualcomm platform is taken as an example to introduce the method of the present disclosure hereinafter. As shown in FIG. 3, the method includes the following steps.

In step 301, a real-time frame rate of the software, and frequency information and load information of a software graphic processing unit in a terminal are collected.

Figure 5:
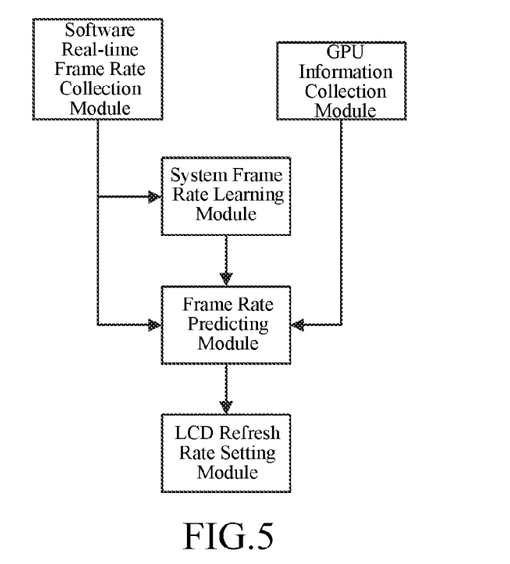
FIG. 5 is a schematic diagram illustrating a structure of a device for adjusting a hardware refresh rate of a terminal provided by the second embodiment of the present disclosure.

As shown in FIG. 5, the embodiment provides a block diagram of a device for adjusting a hardware refresh frequency of a terminal, including: a software real-time frame rate collection module, a GPU information collection module, a system frame rate learning module, a frame rate predicting module and an LCD refresh rate setting module.

The process of collecting the real-time frame rate may include: every time an image has any update, the application will send it to a bottom driver to process, and a special counter is added at the bottom layer to record such update and change of the image. An interface used in a Qualcomm android platform is as follows:

/sys/kernel/debug/msm_fb/0/frame_count

The collection module reads the value of the counter once in every second, and records the value as f(t), then a value of the real-time frame rate is: Fs=f(t)−f(t−1);

the related information of the software graphic processing unit is collected, the processing unit herein s a GPU: the GPU information collection module saves GPUFreq and GPULoad information in 10 s, and calculates out the average information in 10 s.

In step 302, a value of the frame rate of the software in the future preset time period is obtained according to the real-time frame rate of the software.

It is provided that the hardware refresh rates in the embodiment are three typical values: F1=15 frames, F2=40 frames, and F3=60 frames.

After obtaining Fs, the software real-time frame rate collection module judges differences between Fs and F1, F2 and F3.

If Fs<F1 (15), then the predictive value of the frame rate of the software in the future is set to be Fh=F1;

if F1(15)<Fs<F2 (40), then the predictive value of the frame rate of the software in the future is set to be Fh=F2; and if Fs>F2(40), then the predictive value of the frame rate of the software in the future is set to be Fh=F3 (the maximum refresh rate).

In step 303, it is determined whether the software is under a stable frame rate scene, a suddenly-increased frame rate scene or an a suddenly-decreased frame rate scene at current according to the frequency information and the load information.

In the embodiment, the average information in 10 s is calculated out after collecting the GPUFreq and and GPULoad information in 10 s, wherein the calculation method is as follows:

Freq_average=sum(GPUFreq(1),GPUFreq(10)/10

Load_average=sum(GPULoad(1),GPULoad(10))/10

The current GPUFreq and the current GPULoad are compared with the GPU information in the past 10 s.

If GPUFreq-Freq_average>100 Mhz and GPULoad-Load_average>20, then the software is under a suddenly-increased frame rate scene; and if GPUFreq-Freq_average<−100 Mhz and GPULoad-Load_average<−20, then the software is under a suddenly-decreased frame rate scene.

A scene excluding the above two scenes is a stable frame rate scene.

In step 304, when judging that the software is under the stable frame rate scene currently, the value of the frame rate is maintained to be unchanged.

Under the stable state, the accuracy of using the real-time frame rate of the software will be improved greatly; therefore, the predictive value of the frame rate of the software in the future is maintained as Fh under this scene.

In step 305, when judging that the software is under the suddenly-increased frame rate scene, the value of the frame rate is adjusted.

In the case that the software is under the suddenly-increased frame rate scene, it is possible that a user clicks or opens an application with a high software frame rate currently, or the like; in order to prevent frame loss, it is set forcely that Fh=F3 (the maximum refresh rate).

In step 306, when judging that the software is under the suddenly-decreased frame rate scene, a software type of the software is determined, and the value of the frame rate of the software in the future preset time period is re-acquired according to the determination result.

In the case that the software is under the suddenly-decreased frame rate scene, the frame rate of the software in the future is difficult to be evaluated, and a historical software frame rate database in a frame rate learning system needs to be acquired, so as to know whether the current foreground application is a game type application, a reading type application or an ordinary type application.

In the embodiment, a system frame rate learning module may be provided to collect the historical frame rate information of each application program when operating in the foreground; and whether the current foreground application is a game type application, a reading type application or a an ordinary type application is obtained through the historical software frame rate database in the frame rate learning system. For example, a software real-time frame rate collection portion will send the collected real-time frame rate of the software to the system frame rate learning module. The system will store the real-time frame rate Fs of the software of each application program when operating in the foreground; when the frame rate information is collected for more than 500 times, then it is deemed that the historical data collection is completed. Based on these historical frame rate information, a frame rate range of each application program when operating in the foreground is counted, which is as shown in the table below.

TABLE 2

| App Name | 0-15 frames | 15-40 frames | 40-60 frames |
|---|---|---|---|
| App1 | 50 | 50 | 400 |
| App2 | 400 | 100 | 0 |
| App3 | 100 | 350 | 50 |

The system evaluates which type of application that the current foreground application belongs to according to this table.

(1) When a statistic value of the frame rate in the 40-60 frame range is S>350, then the application is deeded to be a game type application; for example, App1 is under a high frame rate of 40-60 frames for a long term;

(2) when a statistic value of the frame rate in the 0-15 frame range is S>350, then the application is deemed to be arcading type application; for example, most historical frame rates of App2 are below 15 frames, and then the application is marked as a reading type application by the system;

(3) when the frame rate does not satisfy the above two conditions, then the application is marked as an ordinary type application;

(4) when a predetermined learning time is not arrived, the application is marked as an ordinary type application by default.

If the application is a game type application, it indicates that the application frame rate under the current application scene will be very high continuously, then Fh is set as F3, i.e. Fh=F3 (the maximum frame rate value);

if the application is a reading type application, it indicates that the application frame rate under the current application scene will be relatively low continuously, then Fh is set as F; and if the application is an ordinary type application, then Fh is set as F2.

In step 307, an LCD hardware refresh rate is set according to the predictive value Fh of the frame rate of the software in the future time period obtained above.

Figure 4:
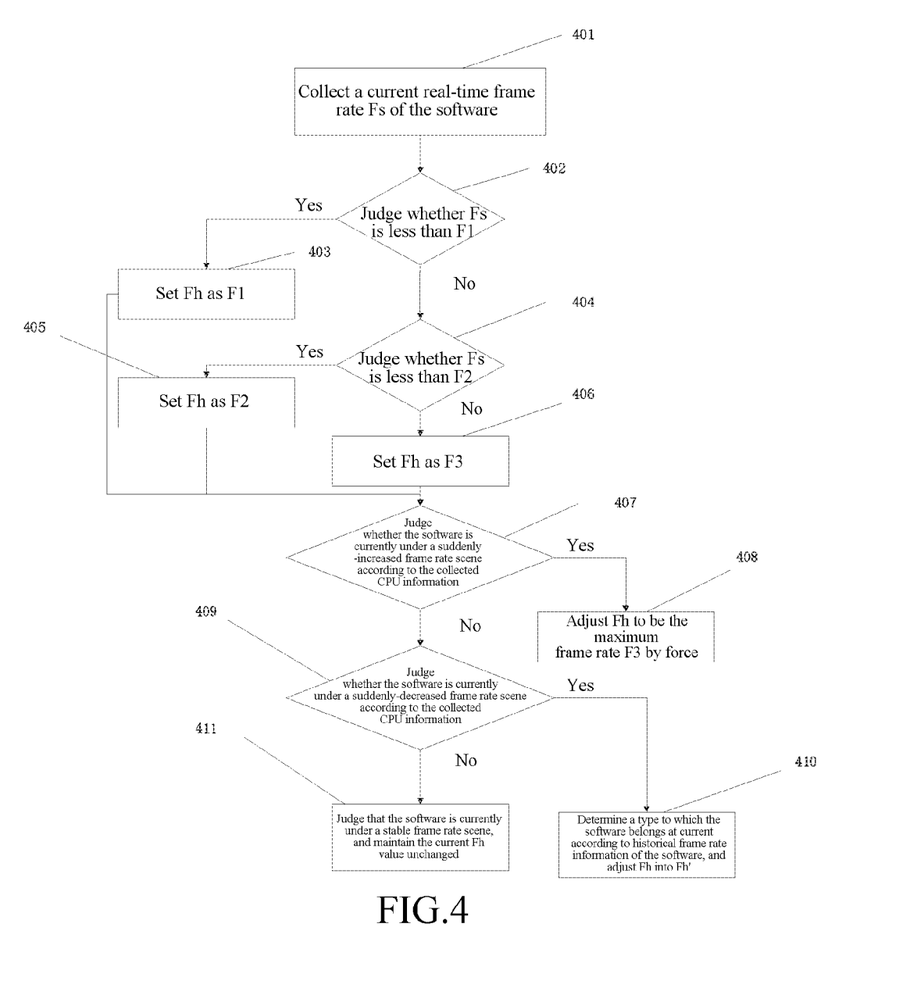
FIG. 4 is a schematic diagram illustrating a flow of predicting a frame rate of a software in a future preset time provided by the second embodiment of the present disclosure.

The specific process of predicting the frame rate of the software in the future time period is introduced in details hereinafter. It is provided that the hardware refresh rates are three typical values: F1=15 frames, F2=40 frames, F3=60 frames, and the predictive. value of the frame rate of the software in the future time period is Fh. As shown in FIG. 4, the process includes the followings steps.

In step 401, a current real-time frame rate Fs of the software is collected.

In step 402, it is judged whether Fs is less than F1; if yes, then step 403 is performed; and if no, then step 404 is performed.

In step 403, Fh is set as F1, and then step 407 is performed.

In step 404, it is judged whether Fs is less than F2; if yes, then step 405 is performed; and if no, then step 406 is performed.

In step 405, Fh is set as F2, and then step 407 is performed.

In step 406, Fh is set as F3.

In the present embodiment, step 402 to step 406 are referred to the specific descriptions of the above step 302.

In step 407, it is judged whether the software is currently under the suddenly-increased frame rate scene according to the collected GPU information; if yes, then step 408 is performed; and if no, then step 409 is performed.

In step 408, Fh is adjusted into the maximum frame rate F3 by force.

In step 409, it is judged whether the software is currently under the suddenly-decreased frame rate scene according to the collected GPU information; if yes, then step 410 is performed; and if no, then step 411 is performed.

In step 410, the type to which the software currently belongs is determined according to the historical frame rate information of the software, and Fh is adjusted as Fh'.

In step 411, the software is judged to be under the stable frame rate scene currently, and the current Fh value is maintained to be unchanged.

Figure 6:
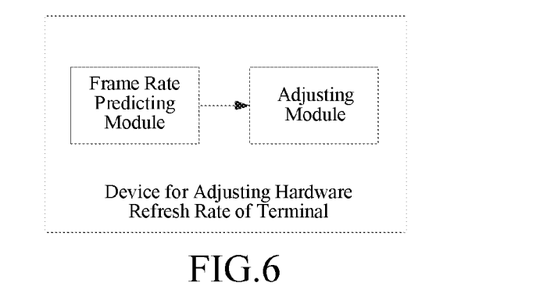
FIG. 6 is a schematic diagram illustrating a structure of a device for adjusting a hardware refresh rate of a terminal provided by a third embodiment of t present disclosure.

Third Embodiment:

As shown in FIG. 6, the embodiment provides a device for adjusting a hardware refresh frequency of a terminal, including: a frame rate predicting module and an adjusting module.

The frame rate predicting module is configured to predict a frame rate of a currently operating software of the terminal in a future preset time period.

The adjusting module is configured to adjust the hardware refresh frequency of the terminal according to the predicted frame rate.

The device according to the embodiment can dynamically adapt the frame rate of the software with the hardware refresh rate, and achieve an object of optimizing the power consumption of a display screen of the terminal, thus reducing the entire power consumption of the terminal.

Figure 7:
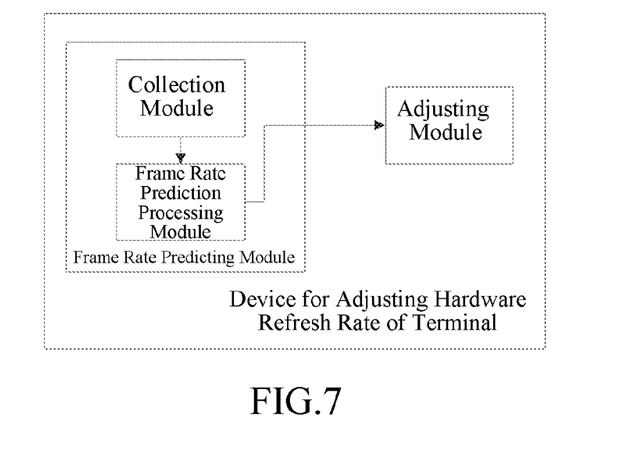
FIG. 7 is a schematic diagram illustrating a structure of another device for adjusting a hardware refresh rate of a terminal provided by the third embodiment of the present disclosure.

Preferably, as shown in FIG. 7, the frame rate predicting module in the embodiment includes: a collection module and a frame rate prediction processing module.

The collection module is configured to collect at least one information of a real-time frame rate of the software, related information of a software graphic processing unit in the terminal and historical frame rate information of the software when operating in a foreground, the related information of the software graphic processing unit including: frequency information and load information of the software graphic processing unit.

The frame rate prediction processing module is configured to predict the frame rate of the currently operating software of the terminal in the future preset time period according to at least one information of the real-time frame rate of the software, the related information of the software graphic processing unit and the historical frame rate information.

Preferably, the collection module is configured to collect the related information of the software graphic processing unit in the terminal; and the frame rate prediction processing module is configured to judge a current frame rate scene of the software according to the frequency information and the load information, and predict the frame rate of the software in the future preset time period according to the judgment result.

Preferably, the frame rate prediction processing module is configured to determine whether the software is under a stable frame rate scene, a suddenly-increased frame rate scene or a suddenly-decreased frame rate scene at current according to the frequency information and the load information; when the software is under the stable frame rate scene, acquire the real-time frame rate of the software, and acquire the frame rate of the software in the future preset time period according to the real-time frame rate; when the software is under the suddenly-decreased frame rate scene, acquire the historical frame rate information of each software when operating in the foreground, determine a software type of the software according to the historical frame rate information, and acquire the frame rate of the software in the future preset time period according to a determination result; and when the software is under the suddenly-increased frame rate scene, set the frame rate of the software in the future preset time period according to a preset rule.

In another scene of the embodiment, the collection module is configured to collect the real-time frame rate of the software and the related information of the software graphic processing unit in the terminal; and the frame rate prediction processing module is configured to obtain a value of the frame rate of the software in the future preset time period according to the real-time frame rate of the software; and judge whether the value of the frame rate needs to be adjusted according to the frequency information and the load information; if yes, then adjust the value of the frame rate; and if no, maintain the value of the frame rate unchanged.

Preferably, the frame rate prediction processing module is configured to determine the current frame rate scene of the software according to the frequency information and the load information; and judge whether the value of the frame rate needs to be adjusted according to the determination result.

Preferably, the frame rate prediction processing module is configured to determine whether the software is under a stable frame rate scene, a suddenly-increased frame rate scene or a suddenly-decreased frame rate scene at current according to the frequency information and the load information; when judging that the software is under the stable frame rate scene, determine that the value of the frame rate does not need to be adjusted; and when judging that the software is under the suddenly-increased frame rate scene or the suddenly-decreased frame rate scene, determine that the value of the frame rate needs to be adjusted.

Preferably, the frame rate prediction processing module is configured to, when judging that the software is under the stable frame rate scene, determine a software type of the software, and acquire the frame rate of the software in the future preset time period according to the determination result.

Preferably, the frame rate prediction processing module is configured to acquire the historical frame rate information of each software in the terminal when operating in the foreground, and determine the software type of the software according to the historical frame rate information.

Preferably, the process of configuring the foregoing frame rate prediction processing module to determine the software type of the software according to the historical frame rate information includes: determining whether the software belongs to a reading type software, an ordinary type software or a game type software according to the historical frame rate information.

The above-mentioned contents are further detailed descriptions to the present disclosure with reference to the specific embodiments, and it cannot be deemed that the specific implementations of the present disclosure are only limited to these descriptions. Those having ordinary skills in the art of the present disclosure may also make many simple deductions or replacements without departing from the concept of the present disclosure which shall all fall within the protection scope of the present disclosure.

INDUSTRIAL APPLICABILITY

As described above, the method and the device for adjusting a hardware refresh rate of a terminal provided by the embodiments of the present disclosure have the following advantageous effects: being capable of automatically adjusting the hardware refresh rate, thus reducing the power consumption of the terminal. In the method according to the embodiments of the present disclosure, the hardware refresh rate of the terminal is dynamically adjusted according to the future software frame rate, so that the frame rate of the software and the hardware refresh rate can be adapted dynamically, and the power consumption of a terminal screen is optimized, thus achieving the effect of optimizing the power consumption of the terminal. Compared with the related arts, the method according to the embodiments of the present disclosure saves the power consumption of the terminal, and increases the battery life of the terminal, thus improving the user experience.

What is claimed is:

1. A method for adjusting a hardware refresh rate of a terminal, comprising:
   predicting a frame rate of currently operating software of the terminal in a future preset time period; and
   adjusting the hardware refresh frequency of the terminal according to the predicted frame rate,
   wherein the step of predicting the frame rate of the currently operating software of the terminal in the future preset time period comprises:
   collecting at least one information of a real-time frame rate of the software, related information of a software graphic processing unit in the terminal and historical frame rate information of the software when operating in a foreground, the related information of the software graphic processing unit comprising: frequency information and load information of the software graphic processing unit; and
   predicting the frame rate of the currently operating software of the terminal in the future preset time period according to at least one information of the real-time frame rate of the software, the related information of the software graphic processing unit and the historical frame rate information,
   wherein;
   the collecting at least one information of the real-time frame rate of the software, the related information of the software graphic processing unit in the terminal and the historical frame rate information of the software when operating in the foreground comprises:
   collecting the related information of the software graphic processing unit in the terminal; and
   the predicting the frame rate of the currently operating software of the terminal in the future preset time period according to at least one information of the real-time frame rate of the software, the related information of the software graphic processing unit and the historical frame rate information comprises:

judging a current frame rate scene of the software according to the frequency information and the load information; and predicting the frame rate of the software in the future preset time period according to a judgment result.

2. The method according to claim 1, wherein the judging the current frame rate scene of the software according to the frequency information and the load information comprises:

judging whether the software is under a stable frame rate scene, a suddenly-increased frame rate scene or a suddenly-decreased frame rate scene at current according to the frequency information and the load information; and the predicting the frame rate of the software in the future preset time period according to the judgment result comprises:

when the software is under the stable frame rate scene, acquiring a real-time frame rate of the software, and acquiring the frame rate of the software in the future preset time period according to the real-time frame rate;

when the software is under the suddenly-decreased frame rate scene, acquiring the historical frame rate information of each software when operating in the foreground, determining a software type of the software according to the historical frame rate information, and acquiring the frame rate of the software in the future preset time period according to the determination result; and when the software is under the suddenly-increased frame rate scene, setting the frame rate of the software in the future preset time period according to a preset rule.

3. The method according to claim 2, wherein the determining the software type of the software according to the historical frame rate information comprises:

determining whether the software belongs to a reading type software, an ordinary type software or a game type software according to the historical frame rate information.

4. A method for adjusting a hardware refresh rate of a terminal, comprising:

predicting a frame rate of currently operating software of the terminal in a future preset time period; and adjusting the hardware refresh frequency of the terminal according to the predicted frame rate, wherein the step of predicting the frame rate of the currently operating software of the terminal in the future preset time period comprises:

collecting at least one information of a real-time frame rate of the software, related information of a software graphic processing unit in the terminal and historical frame rate information of the software when operating in a foreground, the related information of the software graphic processing unit comprising: frequency information and load information of the software graphic processing unit; and predicting the frame rate of the currently operating software of the terminal in the future preset time period according to at least one information of the real-time frame rate of the software, the related information of the software graphic processing unit and the historical frame rate information, wherein:

the collecting at least one information of the real-time frame rate of the software, the related information of the software graphic processing unit in the terminal and the historical frame rate information of the software when operating in the foreground comprises:

collecting the real-time frame rate of the software and the related information of the software graphic processing unit in the terminal; and the predicting the frame rate of the currently operating software of the terminal in the future preset time period according to at least one information of the real-time frame rate of the software, the related information of the software graphic processing unit and the historical frame rate information comprises:

obtaining a value of the frame rate of the software in the future preset time period according to the real-time frame rate of the software; and judging whether the value of the frame rate needs to be adjusted according to the frequency information and the load information; if yes, then adjusting the value of the frame rate; and if no, maintaining the value of the frame rate unchanged.

5. The method according to claim 4, wherein the judging whether the value of the frame rate needs to be adjusted according to the frequency information and the load information comprises:

determining a current frame rate scene of the software according to the frequency information and the load information; and judging whether the value of the frame rate needs to he adjusted according to the determination result.

6. The method according to claim 5, wherein the determining the current frame rate scene of the software according to the frequency information and the load information comprises: determining whether the software is under a stable frame rate scene, a suddenly-increased frame rate scene or a suddenly-decreased frame rate scene at current according to the frequency information and the load information; and the judging whether the value of the frame rate needs to be adjusted according to the determination result comprises:

when judging that the software is under the stable frame rate scene, determining that the value of the frame rate does not need to he adjusted; and when judging that the software is under the suddenly increased frame rate scene or the suddenly-decreased frame rate scene, determining that the value of the frame rate needs to be adjusted.

7. The method according to claim 6, wherein the adjusting the value of the frame rate when judging that the software is under the suddenly-decreased frame rate scene comprises:

determining a software type of the software, and acquiring the frame rate of the software in the future preset time period according to the determination result again.

8. The method according to claim 7, wherein the determining the software type of the software comprises:

acquiring the historical frame rate information of each software in the terminal when operating in the foreground, and determining the software type of the software according to the historical frame rate information.

9. A device for adjusting a hardware refresh frequency of a terminal, comprising:

a processor; and a memory for storing instructions executable by the processor;

wherein the processor is configured to:

predict a frame rate of a currently operating software of the terminal in a future preset time period; and adjust the hardware refresh frequency of the terminal according to the predicted frame rate, wherein the processor is further configured to:

collect at least one information of a real-time frame rate of the software, related information of a software graphic processing unit in the terminal and historical frame rate information of the software when operating in a foreground, the related information of the software graphic processing unit comprising: frequency information and load information of the software graphic processing unit; and predict the frame rate of the currently operating software of the terminal in the future preset time period according to at least one information of the real-time frame rate of the software, the related information of the software graphic processing unit and the historical frame rate information, wherein the processor is further configured to:

collect the related information of the software graphic processing unit in the terminal; and judge a current frame rate scene of the software according to the frequency information and the load information, and predict the frame rate of the software in the future preset time period according to a judgment result.

10. The device according to claim 9, wherein the processor is further configured to: judge whether the software is under a stable frame rate scene, a suddenly-increased frame rate scene or a suddenly-decreased frame rate scene at current according to the frequency information and the load information; when the software is under the stable frame rate scene, acquire the real-time frame rate of the software, and acquire the frame rate of the software in the future preset time period according to the real-time frame rate; when the software is under the suddenly-decreased frame rate scene, acquire the historical frame rate information of each software when operating in the foreground, determine a software type of the software according to the historical frame rate information, and acquire the frame rate of the software in the future preset time period according to the determination result; and when the software is under the suddenly-increased frame rate scene, set the frame rate of the software in the future preset time period according to a preset rule.

11. The device according to claim 10, wherein the processor is further configured to: determine whether the software belongs to a reading type software, an ordinary type software or a game type software according to the historical frame rate information.

12. A device for adjusting a hardware refresh frequency of a terminal, comprising;

a processor; and a memory for storing instructions executable by the processor;

wherein the processor is configured to perform the method for adjusting a hardware refresh rate of a terminal according to claim 4.

13. The device according to claim 12, wherein the processor is further configured to: determine a current frame rate scene of the software according to the frequency information and the load information; and judge whether the value of the frame rate needs to be adjusted according to the determination result.

14. The device according to claim 13, wherein the processor is further configured to: determine whether the software is under a stable frame rate scene, a suddenly-increased frame rate scene or a suddenly-decreased frame rate scene at current according to the frequency information and the load information; when judging that the software is under the stable frame rate scene, determine that the value of the frame rate does not need to be adjusted; and when judging that the software is under the suddenly-increased frame rate scene or the suddenly-decreased frame rate scene, determine that the value of the frame rate needs to be adjusted.

15. The device according to claim 14, wherein the processor is further configured to, when judging that the software is under the suddenly-decreased frame rate scene, determine a software type of the software, and acquire the frame rate of the software in the future preset time period according to the determination result.

16. The device according to claim 15, wherein the processor is further configured to: acquire the historical frame rate information of each software in the terminal when operating in the foreground, and determine the software type of the software according to the historical frame rate information.

* * * * *